United States Patent
Yu et al.

(10) Patent No.: US 8,841,144 B2
(45) Date of Patent: Sep. 23, 2014

(54) METHOD OF MANUFACTURING COLOR FILTER SUBSTRATE WHEREIN A TRANSPARENT SUBSTRATE IS ETCHED TO FORM A PLURALITY OF TRENCHES TO RECEIVE COLOR FILTER MATERIAL

(75) Inventors: Se-Hwan Yu, Asan-si (KR);
Byoung-Joo Kim, Anyang-si (KR);
Hyang-Shik Kong, Seongnam-si (KR);
Kweon-Sam Hong, Seoul (KR);
Yoon-Ho Kang, Yongin-si (KR);
Young-Joo Choi, Hwaseong-si (KR)

(73) Assignee: Samsung Display Co., Ltd, Yongin, Gyeonggi-do (KR)

(*) Notice: Subject to any disclaimer, the term of this patent is extended or adjusted under 35 U.S.C. 154(b) by 893 days.

(21) Appl. No.: 12/357,789

(22) Filed: Jan. 22, 2009

(65) Prior Publication Data
US 2009/0191654 A1    Jul. 30, 2009

(30) Foreign Application Priority Data
Jan. 29, 2008    (KR) .................. 10-2008-0009210

(51) Int. Cl.
*H01L 21/00*    (2006.01)
(52) U.S. Cl.
USPC .................... 438/29; 257/E21.214
(58) Field of Classification Search
CPC ............ H01L 27/3283; H01L 51/0005; H01L 27/1214; H01L 27/1288; H01L 29/4908; H01L 27/322

USPC ............. 438/29; 3/29; 257/E21.214; 216/24; 427/164
See application file for complete search history.

(56) References Cited

U.S. PATENT DOCUMENTS

| | | | |
|---|---|---|---|
| 2002/0054252 A1* | 5/2002 | Ishii et al. | 349/106 |
| 2002/0081503 A1* | 6/2002 | Kawase et al. | 430/7 |
| 2005/0035997 A1* | 2/2005 | Mizutani | 347/44 |
| 2006/0057478 A1* | 3/2006 | Kwon et al. | 430/7 |
| 2006/0292731 A1* | 12/2006 | Kim | 438/57 |
| 2007/0037072 A1* | 2/2007 | Kojima et al. | 430/5 |
| 2007/0269936 A1* | 11/2007 | Tanaka et al. | 438/133 |
| 2008/0280214 A1* | 11/2008 | Ryu | 430/5 |

FOREIGN PATENT DOCUMENTS

| | | |
|---|---|---|
| JP | 08-146214 | 6/1996 |
| JP | 2001281435 | 10/2001 |
| KR | 100280876 | 11/2000 |
| KR | 10-2004-0015040 * | 2/2004 |
| KR | 1020040015040 | 2/2004 |
| KR | 1020050030411 | 3/2005 |
| KR | 1020070001658 | 1/2007 |

* cited by examiner

*Primary Examiner* — Duy T Nguyen
(74) *Attorney, Agent, or Firm* — F. Chau & Associates, LLC

(57) ABSTRACT

A method of manufacturing a color filter substrate includes forming a plurality of trenches having a predetermined depth by etching a surface of a transparent substrate, disposing a color filter material in the plurality of trenches to form a color filter layer, and forming a transparent electrode on the transparent substrate including the color filter layer therein.

9 Claims, 25 Drawing Sheets

METHOD OF MANUFACTURING COLOR FILTER SUBSTRATE WHEREIN A TRANSPARENT SUBSTRATE IS ETCHED TO FORM A PLURALITY OF TRENCHES TO RECEIVE COLOR FILTER MATERIAL

CROSS-REFERENCE TO RELATED APPLICATION

This application claims priority to Korean Patent Application No. 2008-09210 filed on Jan. 29, 2008, the contents of which are incorporated herein by reference in their entirety.

BACKGROUND

1. Technical Field

The present disclosure relates to a method of manufacturing a color filter substrate and a thin film transistor substrate, and more particularly, to a method of manufacturing a color filter substrate and a thin film transistor substrate used in a display apparatus.

2. Discussion of the Related Art

In fabricating a color filter substrate used for a thin film transistor liquid crystal display (TFT-LCD), a color filter layer including a red pixel, a green pixel and a blue pixel is formed. The color filter layer can be formed by a pigment dispersion technology. In the pigment dispersion technology, a photoresist containing a pigment is coated, exposed and developed. A post-bake is performed with respect to the photoresist to form a color filter having a certain color. Then the processes of coating, exposing, developing and post-bake of the photoresist are repeated such that color filters having various colors are sequentially formed.

However, the pigment dispersion technology is complex because the coating process, the exposing process, the developing process and the post-bake process are respectively performed with respect to the red, green and blue photoresist. In the pigment dispersion technology, the photoresist may be wasted because each photoresist is coated through a spin coating process, and then the photoresist is removed in the developing process.

A color filter layer can be formed by an inkjet printing technology. In the inkjet printing technology, a thick black matrix is formed by using an organic material, and color ink including a pigment and a solvent is sprayed through a nozzle by using the thick black matrix as a barrier. Then the solvent is removed.

The inkjet printing technology uses a smaller amount of materials as compared with the pigment dispersion technology.

However, with the inkjet printing technology, the barrier is used to prevent the overflow phenomenon of the color ink. To enhance the color reproducibility and to reduce the coupling phenomenon between pixels, the barrier having a high height is required. Thus, an organic black matrix that has a thickness of about 3 μm is used. However, when the organic black matrix has the thickness of about 3 μm, the exposure process and the pre-bake process are performed for an extended period of time due to the increased thickness of the organic black matrix. The extended period time of the exposure process and the pre-bake process to the black matrix can cause remnants, wrinkles and instability of a pattern to the black matrix.

SUMMARY OF THE INVENTION

According to an exemplary embodiment of the present invention, a method of manufacturing a color filter substrate comprises forming a plurality of trenches having a predetermined depth by etching a surface of a transparent substrate, disposing a color filter material in the plurality of trenches to form a color filter layer, and forming a transparent electrode on the transparent substrate including the color filter layer therein.

Forming the plurality of trenches may comprise forming a photoresist pattern on the surface of the transparent substrate, etching the transparent substrate using the photoresist pattern as a mask, and removing the photoresist pattern from the transparent substrate.

The color filter layer may have a substantially identical thickness to the predetermined depth of the plurality of trenches.

The predetermined depth can be about 0.5 μm to about 5 μm when measured from the surface of the transparent substrate.

Etching the transparent substrate can be performed by using an etching solution including HF or an HF mixture.

Disposing the color filter material can be performed by repeating a drop process and a bake process with respect to a predetermined area to form the color filter layer in the predetermined area.

The bake process can be performed using a thermal jetting.

Forming the plurality of trenches in the transparent substrate may comprise forming a black matrix pattern including an organic material in a predetermined area of the surface of the transparent substrate, and etching the transparent substrate using the organic black matrix pattern as a mask.

The transparent electrode can be formed on the color filter layer and the organic black matrix pattern.

The organic black matrix can have a thickness of about 1 μm or below.

According to an exemplary embodiment of the present invention, a method of manufacturing a color filter substrate comprises forming a photoresist pattern on a surface of a transparent substrate, forming a plurality of trenches having a predetermined depth by etching the surface of the transparent substrate using the photoresist pattern as a mask, partially removing the photoresist pattern such that a contact area of the photoresist pattern is identical to a contact area of the transparent substrate, disposing color filter material in each trench such that the color filter material overlaps a lower end of the photoresist pattern, removing the photoresist pattern, forming a black matrix including an organic material in an area of the transparent substrate where the photoresist pattern is removed and forming a transparent electrode on the color filter layer and the organic black matrix.

Disposing the color filter material can be performed by repeating a drop process and a bake process in a predetermined area to form the color filter layer in the predetermined area.

The bake process can be performed using a thermal jetting.

The color filter layer can have a thickness greater than a depth of the plurality of trenches.

The color filter layer can have a substantially identical thickness to a thickness obtained by adding the predetermined depth of the plurality of trenches to a thickness of the organic black matrix.

The photoresist pattern can be partially removed through a plasma ashing process.

The organic black matrix can be formed through an inkjet printing process.

The predetermined depth can be about 0.5 μm to about 5 μm when measured from the surface of the transparent substrate.

Etching the transparent substrate can be performed by using an etching solution including HF or an HF mixture.

According to an exemplary embodiment of the present invention, a method of manufacturing a thin film transistor comprises forming a signal line section on a base substrate to define a plurality of pixel areas, etching the base substrate using the signal line section as a mask to form a plurality of trenches on the base substrate, the plurality of trenches corresponding to the pixel areas, respectively, disposing a color filter material in each trench by using an inkjet printing method to form a color filter layer, forming an organic layer on the color filter layer and the signal line section, forming a thin film transistor on the organic layer, and forming a pixel electrode electrically connected to the thin film transistor.

The signal line section may comprise a plurality of data lines extending in a first direction and a plurality of gate lines extending in a second direction substantially perpendicular to the first direction, and each of the gate lines is divided into a plurality of gate-line pieces each of which is arranged between two adjacent data lines.

Prior to forming the thin film transistor on the organic layer, may further comprise forming an opening that exposes a gate electrode of the thin film transistor, forming first and second contact holes that expose both ends of the gate-line pieces, respectively, and forming a third contact hole that partially exposes the data lines.

Forming the thin film transistor may comprise forming a semiconductor layer for the thin film transistor corresponding to the opening, and forming a source electrode and a drain electrode spaced apart from the source electrode on the semiconductor layer.

The source electrode can be connected to a corresponding data line through the third contact hole.

Forming the source and drain electrodes may comprise forming a bridge electrode electrically connecting two adjacent gate-line pieces to each other through the first and second contact holes.

Forming the source and drain electrodes may comprise forming a storage electrode.

Prior to forming the pixel electrode may further comprise forming a protective layer covering the thin film transistor, and forming a fourth contact hole through the protective layer to expose the drain electrode of the thin film transistor.

The pixel electrode can be formed on the protective layer and electrically connected to the drain electrode of the thin film transistor through the fourth contact hole.

The organic layer may comprise a low dielectric material having a dielectric constant of about 3.

BRIEF DESCRIPTION OF THE DRAWINGS

Exemplary embodiments of the present disclosure can be understood in more detail from the following description taken in conjunction with the accompanying drawings of which.

DESCRIPTION OF EXEMPLARY EMBODIMENTS

Exemplary embodiments of the present invention will be described in more detail with reference to the accompanying drawings. The present invention may, however, be embodied in many different forms and should not be construed as limited to the embodiments set forth herein.

Figure 1:
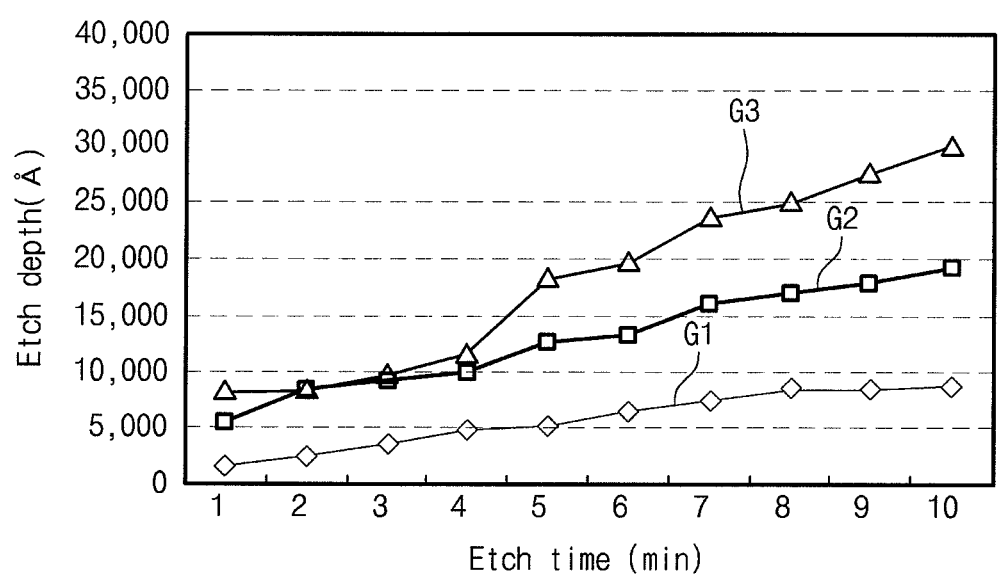
FIG. 1 is a graph representing an etching depth of a glass according to concentration of an etching solution and an etching time.

FIG. 1 is a graph representing an etching depth of a glass according to a concentration of an etching solution and an etching time. The etching solution includes Hydrogen Fluoride (HF), and concentration of the HF represents a weight percent of the HF diluted with ultra pure water.

In FIG. 1, a first graph G1 represents an etching depth according to the time when the HF is diluted at a ratio of 50:1, a second graph G2 represents an etching depth according to the time when the HF is diluted at a ratio of 10:1, and a third graph G3 represents an etching depth according to the time when the HF is diluted at a ratio of 5:1.

Referring to FIG. 1, the etching depths of the glass linearly increase proportionally to the etching time over the entire dilution range. An exemplary embodiment of the present invention forms the trench in the glass in accordance with the above linear etching characteristics.

Figure 2A:
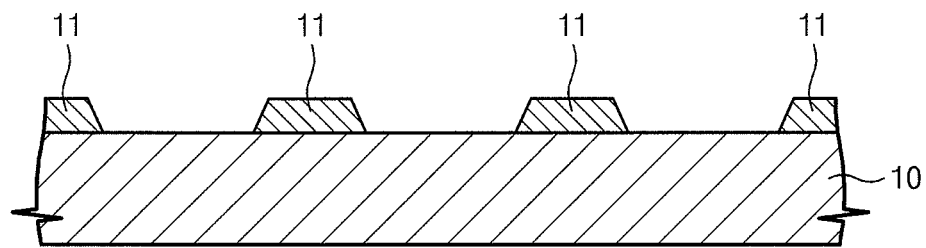
FIGS. 2A to 2E are sectional views representing a method of manufacturing a color filter substrate according to an exemplary embodiment of the present invention.
Figure 2B:
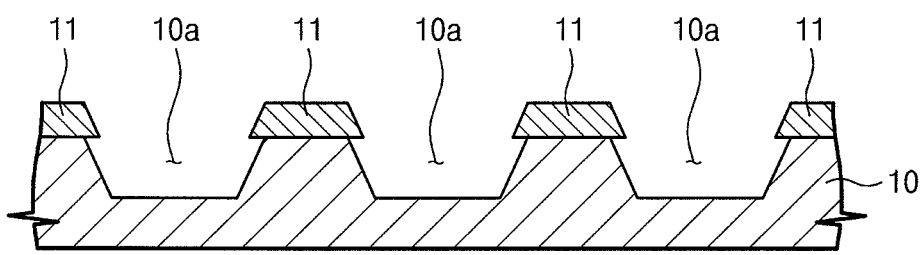
Figure 2C:
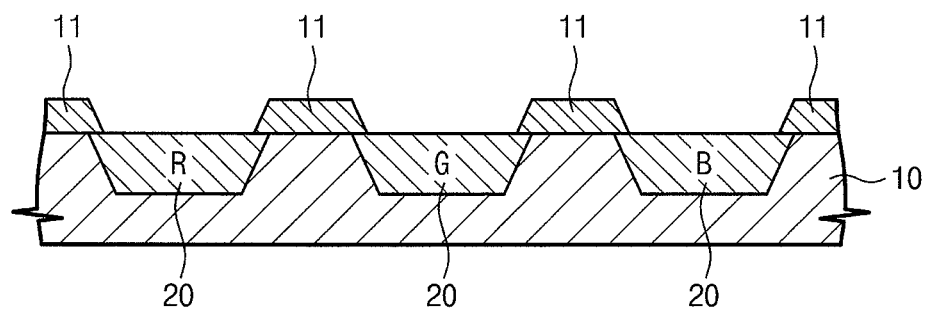
Figure 2D:
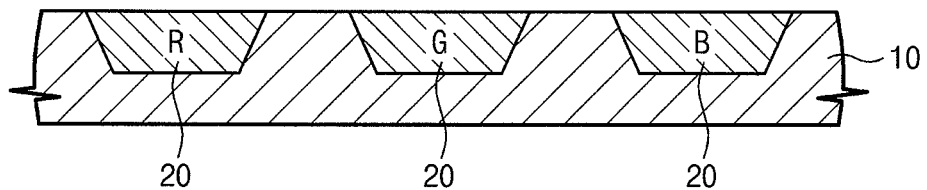
Figure 2E:
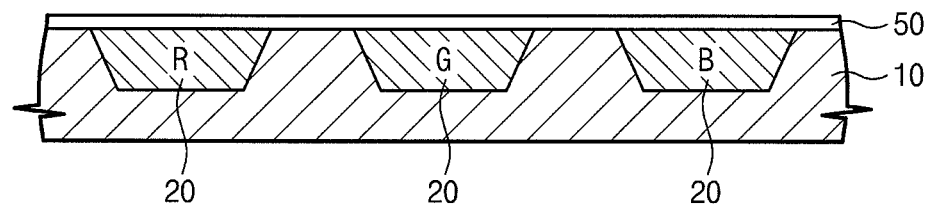

FIGS. 2A and 2E are sectional views representing a method of manufacturing a color filter substrate according to an exemplary embodiment of the present invention.

Referring to FIG. 2A, a photoresist pattern 11 is formed on a glass substrate 10 such that a surface of the glass substrate 10 is partially exposed. The photoresist pattern 11 includes a positive type photoresist.

Referring to FIG. 2B, the glass substrate 10 is etched using the photoresist pattern 11 as a mask, thereby forming a plurality of trenches 10a having a predetermined depth on the surface of the glass substrate 10. In the above etching process, the etching solution including HF or an HF mixture is used. The etching process is performed by, for example, applying ultrasonic waves or bubbles when the glass substrate 10 is dipped into the above etching solution.

An etch rate of the glass substrate 10 is adjusted according to the concentration of the etching solution including HF or the HF mixture and the etching time. For instance, the concentration of the etching solution and the etching time are adjusted such that the trenches 10a formed in the glass substrate 10 have a depth of about 0.5 μm to about 5 μm. In an exemplary embodiment, an organic black matrix (BM) used as a barrier to prevent an overflow phenomenon of ink has a height of about 3 μm. Accordingly, if the trenches 10a have depths corresponding to the height of the organic black matrix, the barrier having a height corresponding to the organic black matrix may be integrally formed with the glass substrate 10.

An undercut may occur during the etching process of forming the trenches 10a in the glass substrate 10. The undercut refers to a phenomenon in which the glass substrate 10 is excessively etched as compared with a lower edge of the photoresist pattern 11.

Referring to FIG. 2C, a color filter layer 20 including a red pixel R, a green pixel G and a blue pixel B is formed in the trenches 10a, which are formed in the glass substrate 10, through an inkjet printing process by using the photoresist pattern 11 as a mask. An area having the undercut is filled with the color pixels through the inkjet printing process.

The red, green and blue pixels R, G and B are formed in the trenches 10a with a substantially identical thickness to a depth of the trench 10a, so that the color filter substrate has a flat surface.

Ink dropped in the above inkjet printing process is leveled in a wet state before a bake process. When the bake process including a convection oven bake process or a hot-plate process is performed, the ink is changed into a dome shape due to difference of a temperature at a periphery of the barrier. Such a dome shape may degrade the display characteristic. Accordingly, in the inkjet printing process using dropped ink, a profile of ink may be controlled by adjusting the number of ink drops and the baking method.

Figure 3:
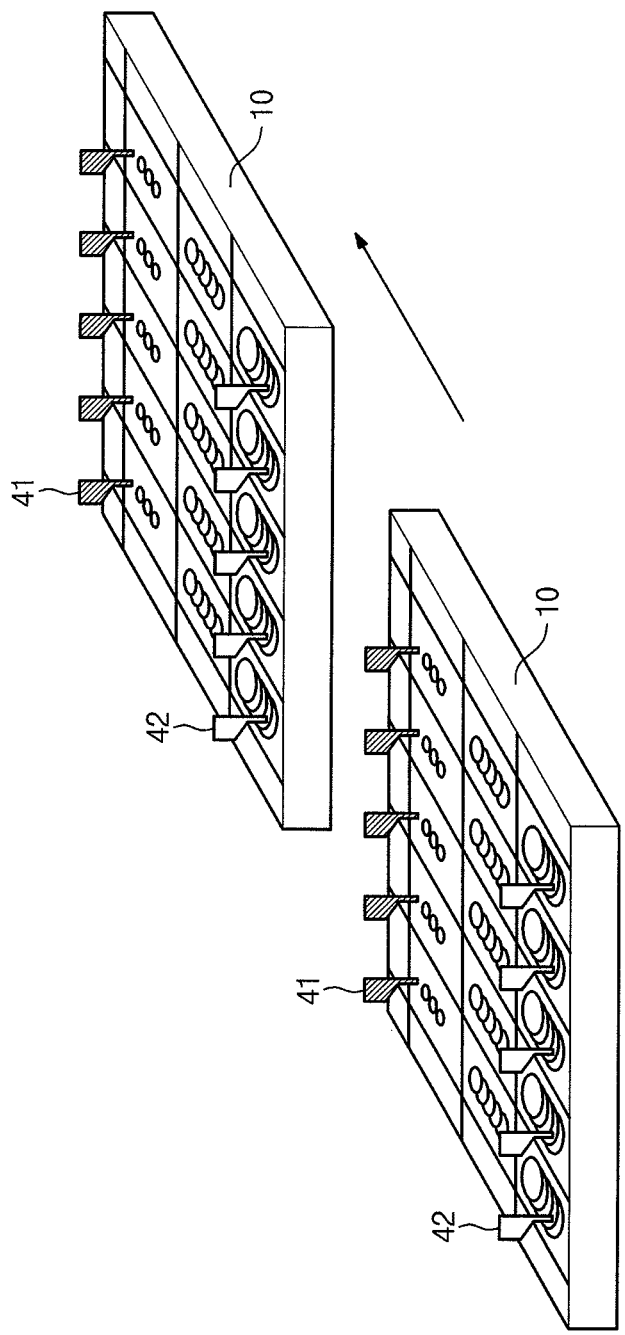
FIG. 3 shows a method of performing an inkjet printing process by repeating a drop process and a bake process according to an exemplary embodiment of the present invention.

Therefore, as shown in FIG. 3, the inkjet printing process is performed by repeating the drop process and the bake process in a predetermined area, thereby flattening the ink. As an example of the present invention, the bake process may be performed through a thermal jetting scheme.

Referring to FIG. 3, during the inkjet printing process, the drop process and the bake process are repeatedly performed to flatten the ink. When the inkjet printing process is performed by installing a baking unit 42 at a rear side of an inkjet unit 41 without using additional bake equipment, the process time and the manufacturing cost may be reduced.

Referring to FIG. 2D, the photoresist pattern 11 is removed from the surface of the glass substrate 10 by using, for example, a lift-off scheme after the inkjet printing process is finished.

Referring to FIG. 2E, a common electrode 50, which forms an electric field in corporation with a pixel electrode provided on the other substrate in opposition to the common electrode 50, is formed on the surface of the glass substrate 10 and the color filter layer 20. In an exemplary embodiment, the common electrode 50 includes transparent conductive material, such as indium tin oxide (ITO) or indium zinc oxide (IZO). In an exemplary embodiment, the common electrode 50 is patterned to be used in a Patterned Vertical Alignment (PVA) liquid crystal display. In an exemplary embodiment, an overcoat layer may be formed on the common electrode 50 to protect the common electrode 50.

Since the color filter substrate shown in FIGS. 2A to 2E does not have a black matrix, the color filter substrate described above is applied to a black matrix-less (BM-less) structure or a structure in which the black matrix is provided in a different substrate.

In an exemplary embodiment, since the color filter substrate has a flat structure throughout the entire area of the color filter substrate, the display characteristic may be improved and the color filter substrate may have improved constant ratio.

FIGS. 4A to 4G are sectional views representing a method of manufacturing a color filter substrate according to an exemplary embodiment of the present invention.

Figure 4A:
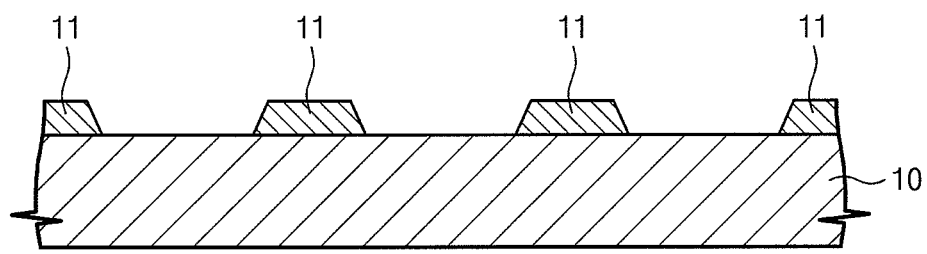
FIGS. 4A to 4G are sectional views representing a method of manufacturing a color filter substrate according to an exemplary embodiment of the present invention.
Figure 4B:
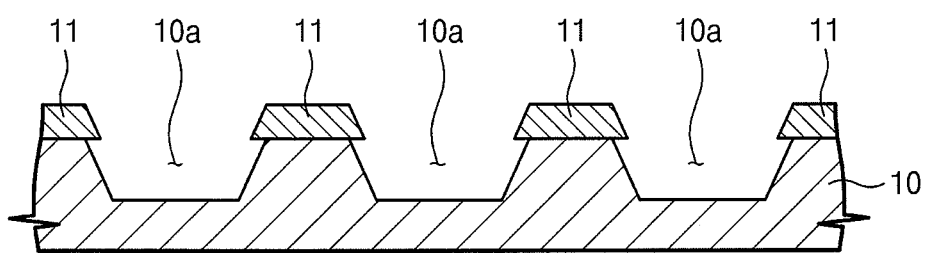

The processes shown in FIGS. 4A and 4B are identical to those shown in FIGS. 2A and 2B. Through the processes shown in FIGS. 4A and 4B, a plurality of trenches 10a are formed in the surface of the glass substrate 10.

Figure 4C:
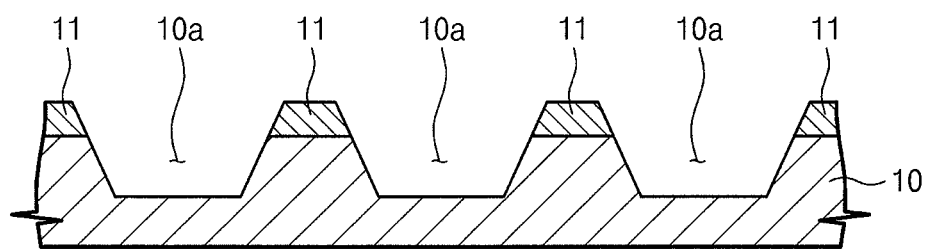

Referring to FIG. 4C, the photoresist pattern 11 is removed using a plasma ashing process from an area having the undercut, which is formed during a process shown in FIG. 4B. The undercut is generated when the glass substrate 10 is excessively etched as compared with the lower edge of the photoresist pattern 11. Oxygen ($O_2$) may be used, for example, exclusively as ashing gas for the plasma ashing process. Alternatively, mixed gas including oxygen serving as main gas and functional additive gas including one selected from Sulfur Hexafluoride ($SF_6$), Chlorine ($CL_2$), Argon (Ar), Nitrogen ($N_2$) and Helium (He) may be used as ashing gas.

Figure 4D:
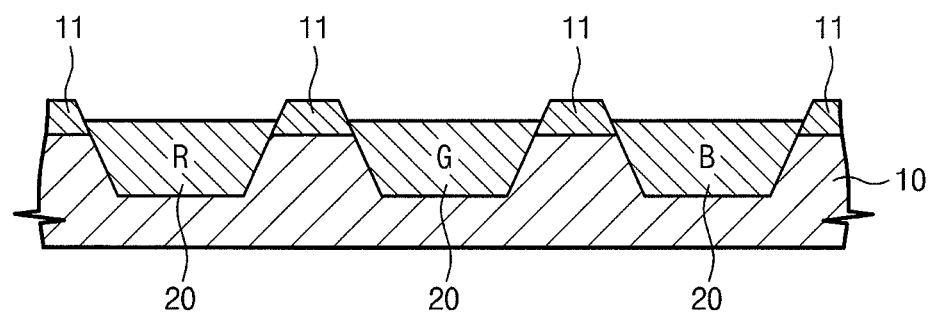

Referring to FIG. 4D, the red, green and blue pixels R, G and B are formed through the inkjet printing process to form the color filter layer 20. The color filter layer 20 formed through the inkjet printing process has a substantially identical thickness to a thickness obtained by adding a thickness of an organic black matrix 60, which is formed later in FIG. 4F, to a depth of the trench 10a provided in the glass substrate 10. Accordingly, the surface of the color filter layer 20 is disposed above the surface of the glass substrate 10.

Figure 4E:
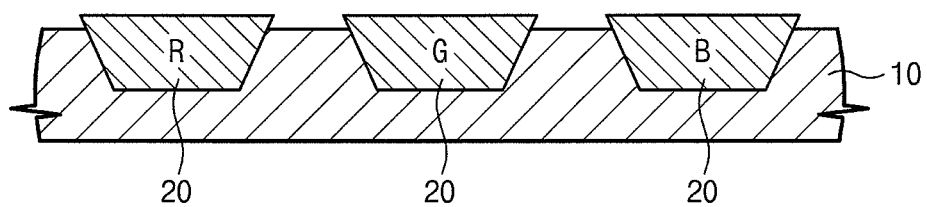

Referring to FIG. 4E, a strip process is performed with respect to the photoresist pattern 11, so that a space to be filled with the organic black matrix 60 is provided in the glass substrate 10.

Figure 4F:
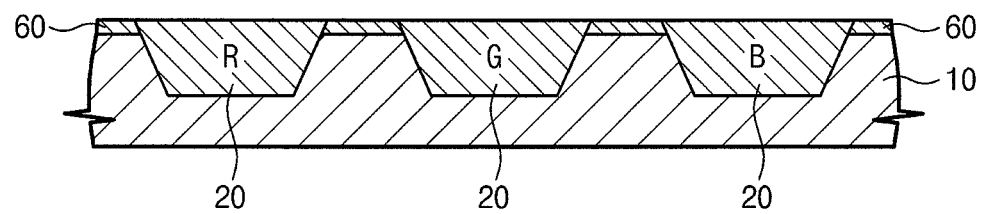

Referring to FIG. 4F, the organic black matrix 60 is formed in the space provided in the glass substrate 10. The organic black matrix 60 may be formed through the inkjet-printing scheme. The organic black matrix 60 has a thickness of about 1 μm or below. That is, since a barrier, which is integrally formed with the glass substrate 10 through the trenches 10a, is provided among the red, green and blue pixels R, G and B, the organic black matrix 60 has a height lower than that of the conventional organic black matrix.

Figure 4G:
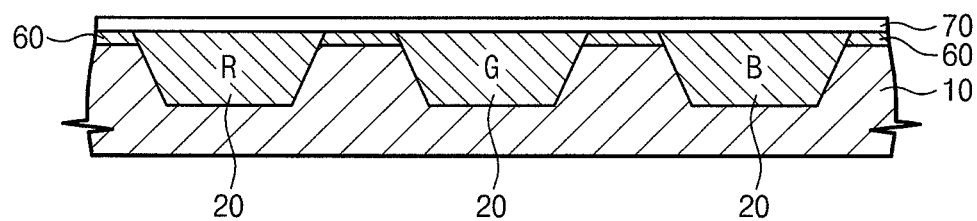

Referring to FIG. 4G, a common electrode 70 is formed on the color filter layer 20 and the organic black matrix 60.

In an exemplary embodiment, to form the organic black matrix 60 on the glass substrate 10, the thickness of the color filter layer 20 can be increased relative to the thickness of the organic black matrix 60, so that the color filter substrate has a flat structure over the entire area of the color filter substrate. Accordingly, the display quality may be improved, the manufacturing cost may be reduced, and the manufacturing process may be simplified.

FIGS. 5A to 5D are sectional views representing a method of manufacturing a color filter substrate according to an exemplary embodiment of the present invention.

Figure 5A:
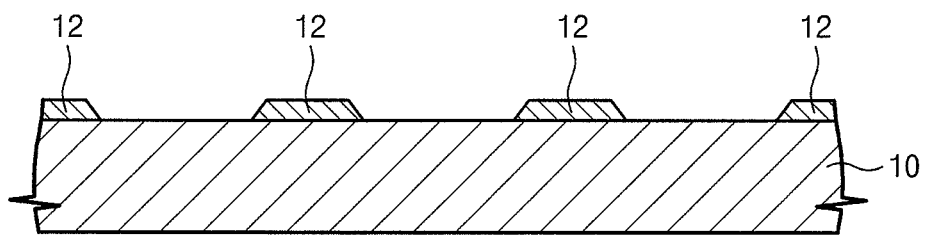
FIGS. 5A to 5D are sectional views representing a method of manufacturing a color filter substrate according to an exemplary embodiment of the present invention.
Figure 5B:
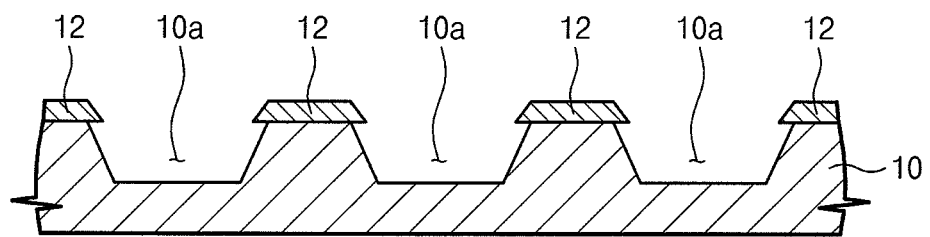

Referring to FIG. 5A, an organic black matrix pattern 12 is formed on the glass substrate 10. The glass substrate 10 is etched by using the organic black matrix pattern 12 as a mask. Referring to FIG. 5B, a plurality of trenches 10a having a predetermined depth are formed in the glass substrate 10. The processes of etching the glass substrate 10 are substantially identical to those shown in, for example, FIGS. 2A and 2B.

Figure 5C:
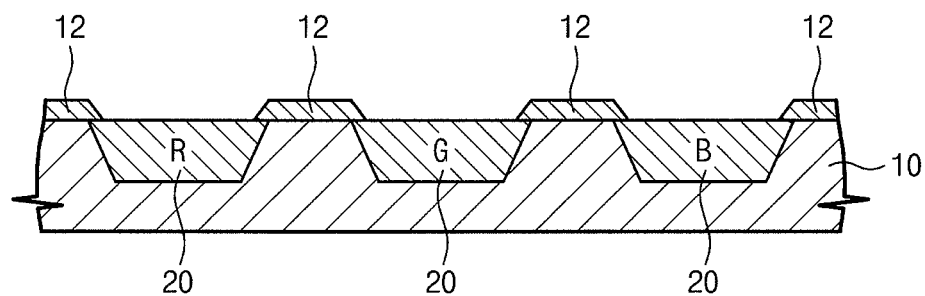
Figure 5D:
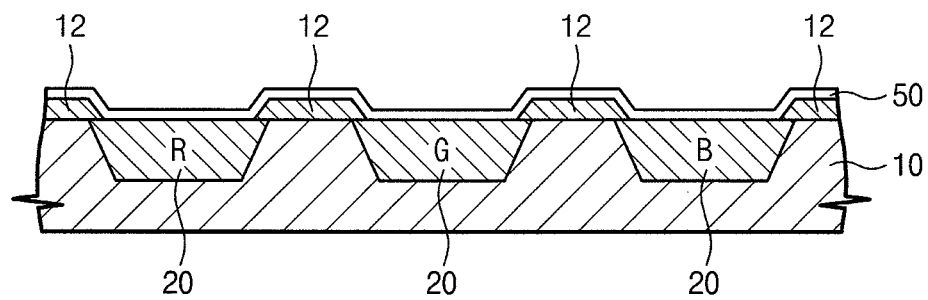

Referring to FIG. 5C, the red, green and blue pixels R, G and B are formed in the trenches 10a through the inkjet printing process similarly to the process shown in FIG. 2C. Accordingly, the color filter layer 20 is formed in the glass substrate 10. Referring to FIG. 5D, the common electrode 50 is formed on the color filter layer 20 and the organic black matrix pattern 12.

The organic black matrix pattern 12 has a thickness of about 1 μm or below. That is, a barrier is provided among the red, green and blue pixels R, G and B such that the barrier is integrally formed with the glass substrate 10 through the trenches 10a. In an exemplary embodiment, the organic black matrix pattern 12 has a height lower than that of the conventional black matrix pattern.

FIGS. 6A to 6I are plan views representing a method of manufacturing a thin film transistor substrate according to an exemplary embodiment of the present invention. FIGS. 7A to 7C are sectional views taken along the lines I-I' of FIGS. 6A to 6C, respectively. FIG. 7D is a sectional view representing a planarization of a base substrate shown in FIG. 7C.

Figure 6A:
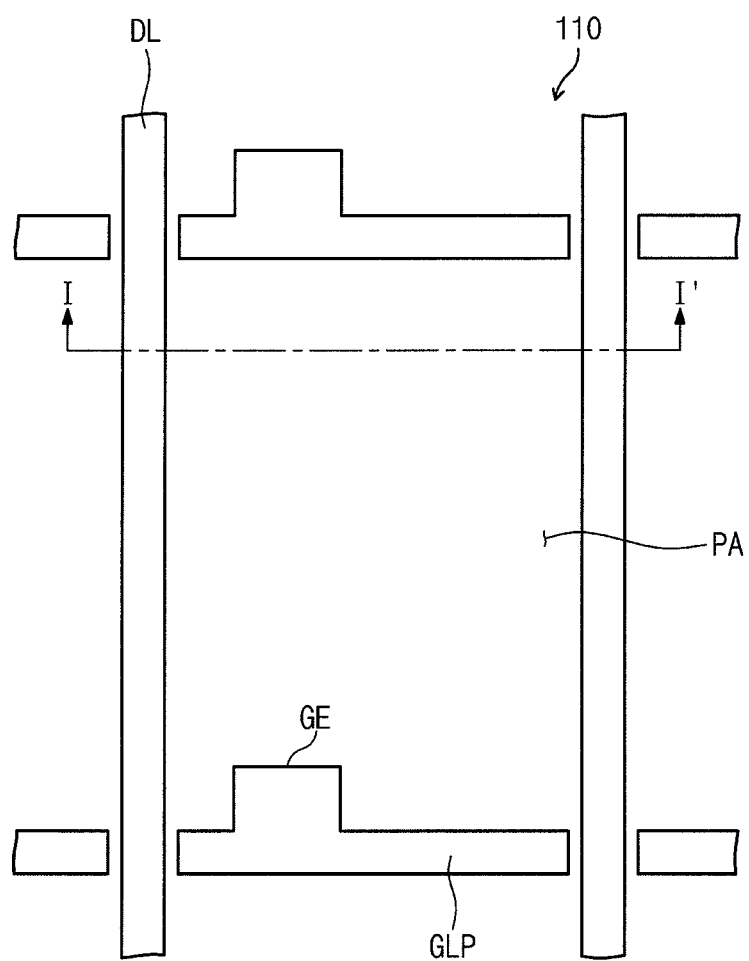
FIGS. 6A to 6I are plan views representing a method of manufacturing a thin film transistor substrate according to an exemplary embodiment of the present invention.
Figure 7A:
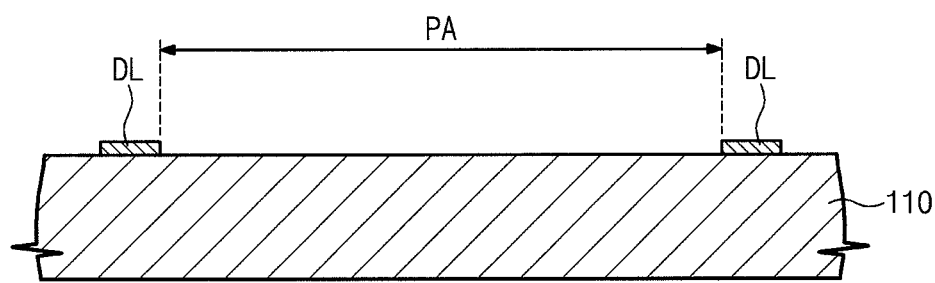
FIGS. 7A to 7C are respective sectional views taken along the lines II-II' of FIGS. 6A to 6C.
Figure 7B:
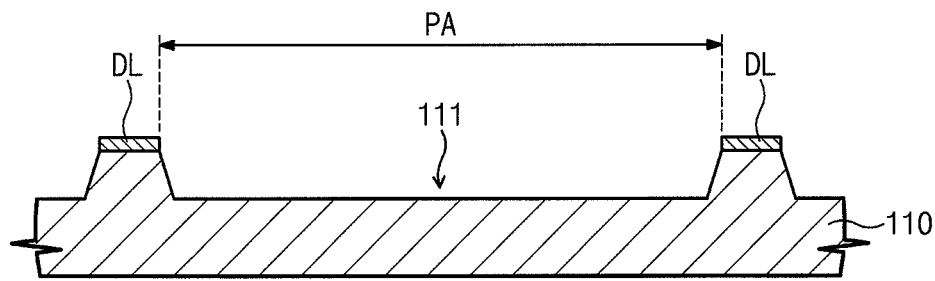
Figure 7C:
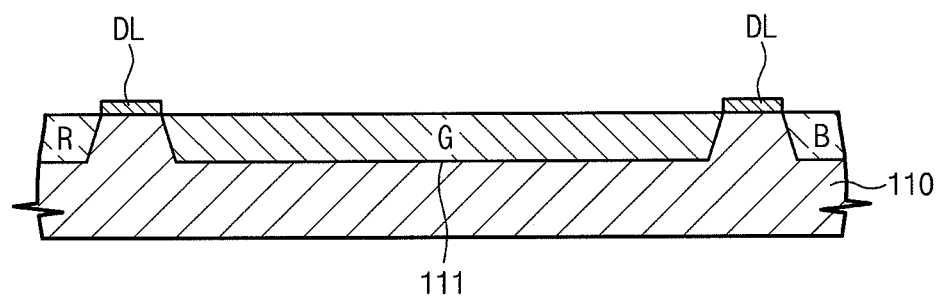
Figure 7D:
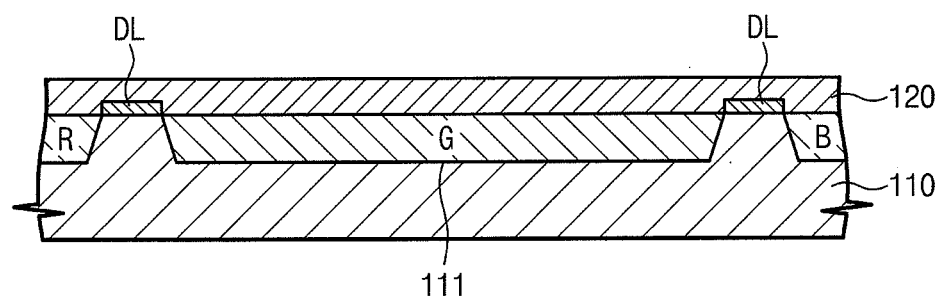
FIG. 7D is a sectional view representing a planarization of a base substrate shown in FIG. 7C.

Referring to FIGS. 6A and 7A, a plurality of data lines DL and a plurality of gate lines are formed on a base substrate 110 of glass. Each of the gate lines is divided into a plurality of gate-line pieces GLP. Each of the gate-line pieces GLP is arranged between two adjacent data lines of the data lines DL.

The data lines DL are extended in a first direction D1 and arranged along a second direction D2 substantially perpendicular to the first direction D1 such that the data lines DL are parallel to each other. The gate-line pieces GLP are extended in the second direction D2. The gate-line pieces GLP are formed by cutting the gate lines extending in the second direction D2 at a crossing area between the data lined DL and the gate lines.

As an example of the present invention, the data lines DL and the gate-line pieces GLP may be formed by patterning a first metal layer formed on the base substrate 110. Thus, the data lines DL and the gate-line pieces GLP may have the same material.

The base substrate 110 includes a plurality of pixel areas PA defined by the data lines DL and the gate-line pieces GLP. Each of the gate-line pieces GLP is provided with a gate electrode GE branching from the gate-line pieces GLP.

Figure 6B:
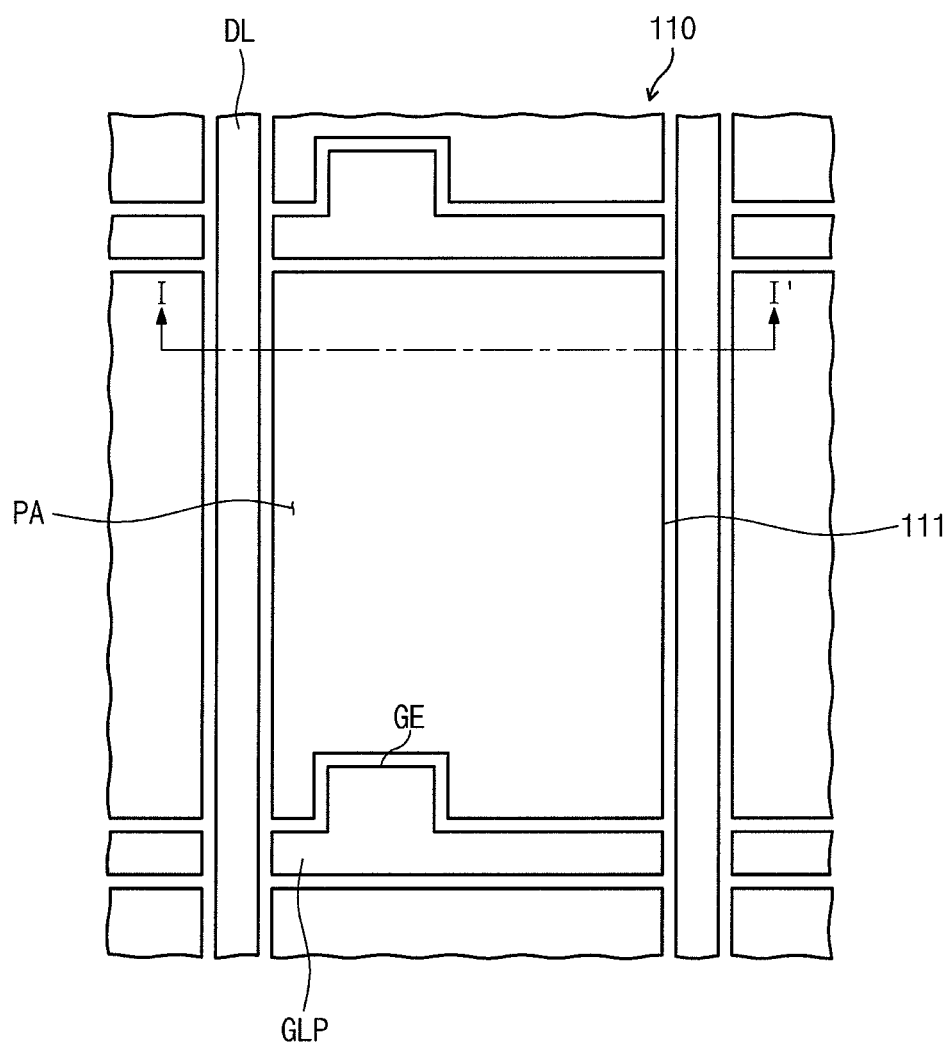

Referring to FIGS. 6B and 7B, the base substrate 10 is etched by using the data lined DL and the gate-line pieces GLP as a mask. As a result, a plurality of trenches 111 are formed on the base substrate 110 corresponding to the pixel areas PA, respectively.

In the etching process of the base substrate 110, HF or an HF mixture is used as an etching solution. The etching process is performed by applying ultrasonic waves or bubbles when the base substrate 110 is dipped into the above etching solution. An etch rate of the base substrate 110 is adjusted according to the concentration of the etching solution including HF or the HF mixture and the etching time. That is, the depth of the trenches 111 may be adjusted by adjusting the concentration of the etching solution and the etching time.

Figure 6C:
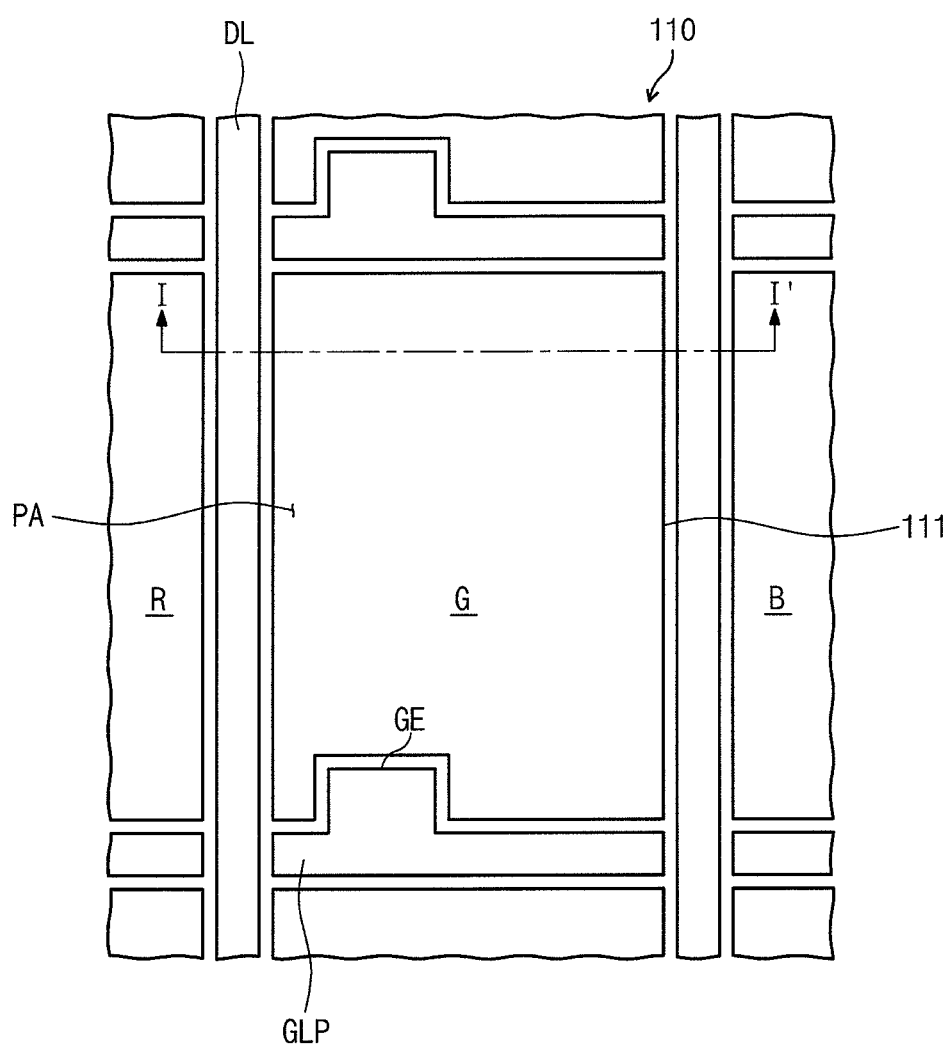

Referring to FIGS. 6C and 7C, a red pixel R, a green pixel C and a blue pixel B are formed in the trenches 111 through an inkjet printing process. The red, green and blue pixels R, G and B are formed in the trenches 111 with a substantially identical thickness to a depth of the trenches 111, so that the base substrate 110 may have a flat surface.

Referring to FIG. 7D, an organic layer 120 is formed over the base substrate 110 where the red, green and blue pixels R, C and B are formed in the trenches 111. The organic layer 120 may planarize a step difference between the red, green and blue pixels R, G and B and the data lines DL.

FIGS. 8A to 8F are sectional views taken along the lines II-II' of FIGS. 6D to 6I, respectively.

Figure 6D:
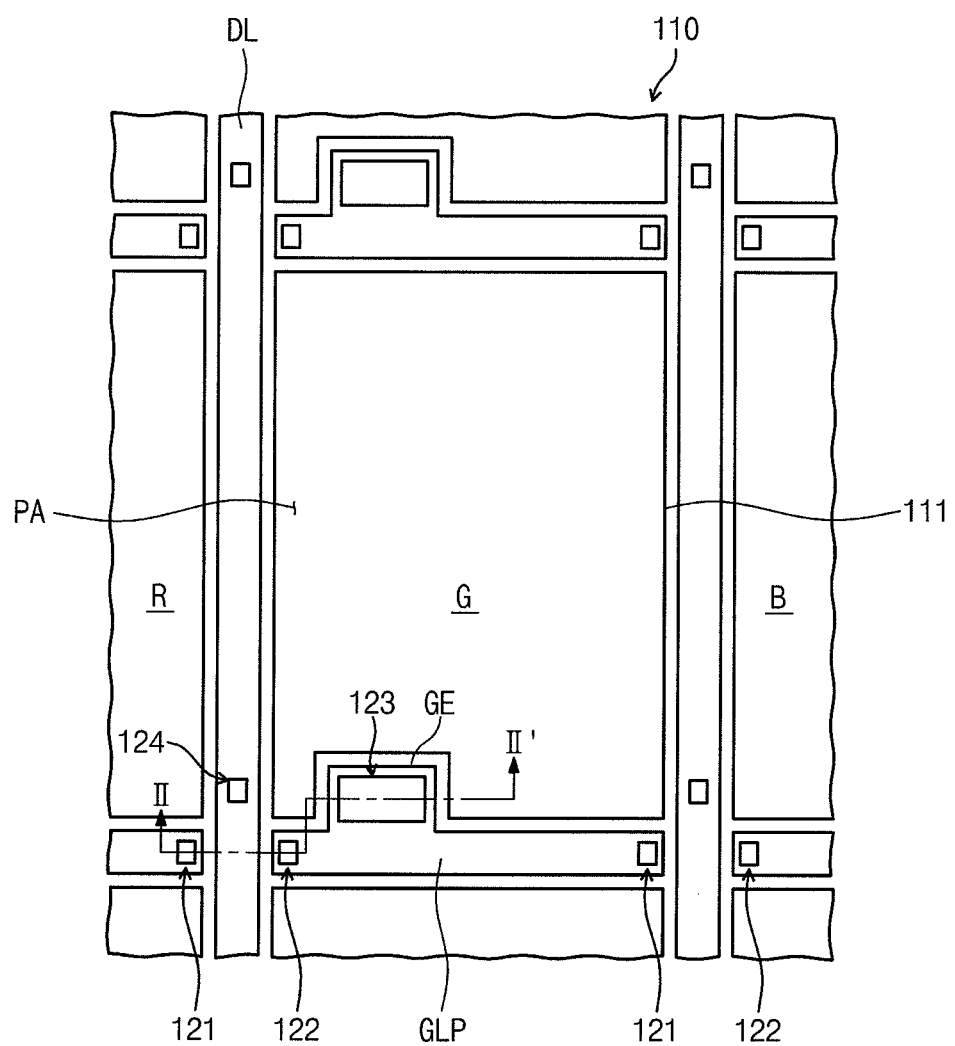
Figure 8A:
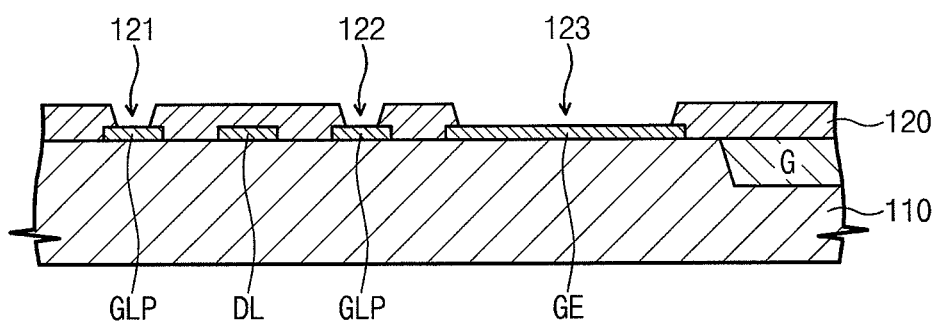
FIGS. 8A to 8F are respective sectional views taken along the lines II-II' of FIGS. 6D to 6I.

Referring to FIGS. 6D and 8A, the organic layer 120 is patterned to form an opening 123, a first contact hole 121, a second contact hole 122 and a third contact hole 124 through the organic layer 120.

The opening 123 is formed corresponding to the gate electrode GE to expose the gate electrode GE. The first and second contact holes 121 and 122 are formed corresponding to both ends of the gate-line pieces GLP, respectively, to partially expose the both ends of the gate-line pieces GLP. The third contact hole 124 is positioned at a position adjacent to the gate electrode GE and corresponding to the data lines DL. Thus, the data lines DL are partially exposed through the third contact hole 124.

Figure 6E:
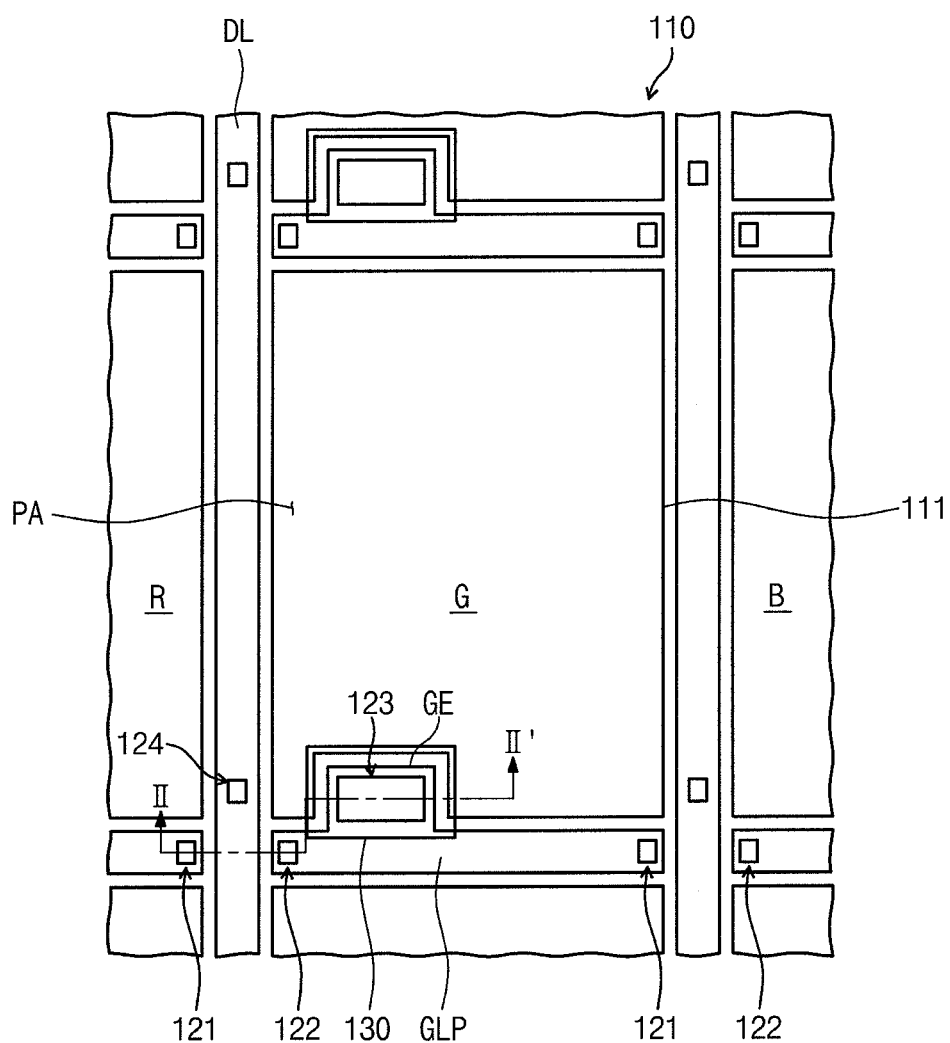
Figure 8B:
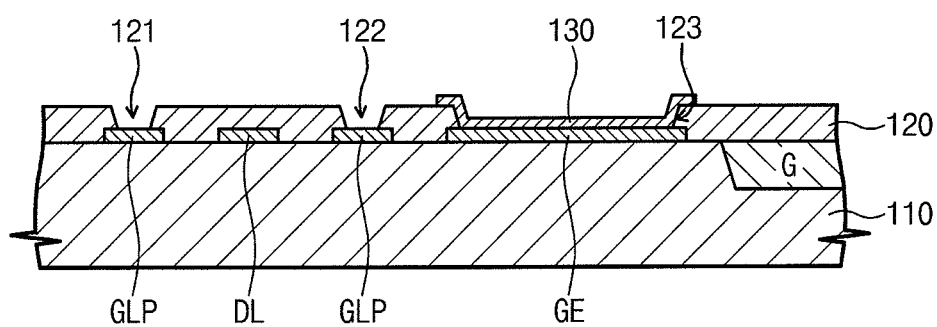

Referring to FIGS. 6E and 8B, a semiconductor layer 130 is formed on the gate electrode GE exposed through the opening 123. The semiconductor layer 130 may include amorphous silicon layer and an ohmic contact layer.

Figure 6F:
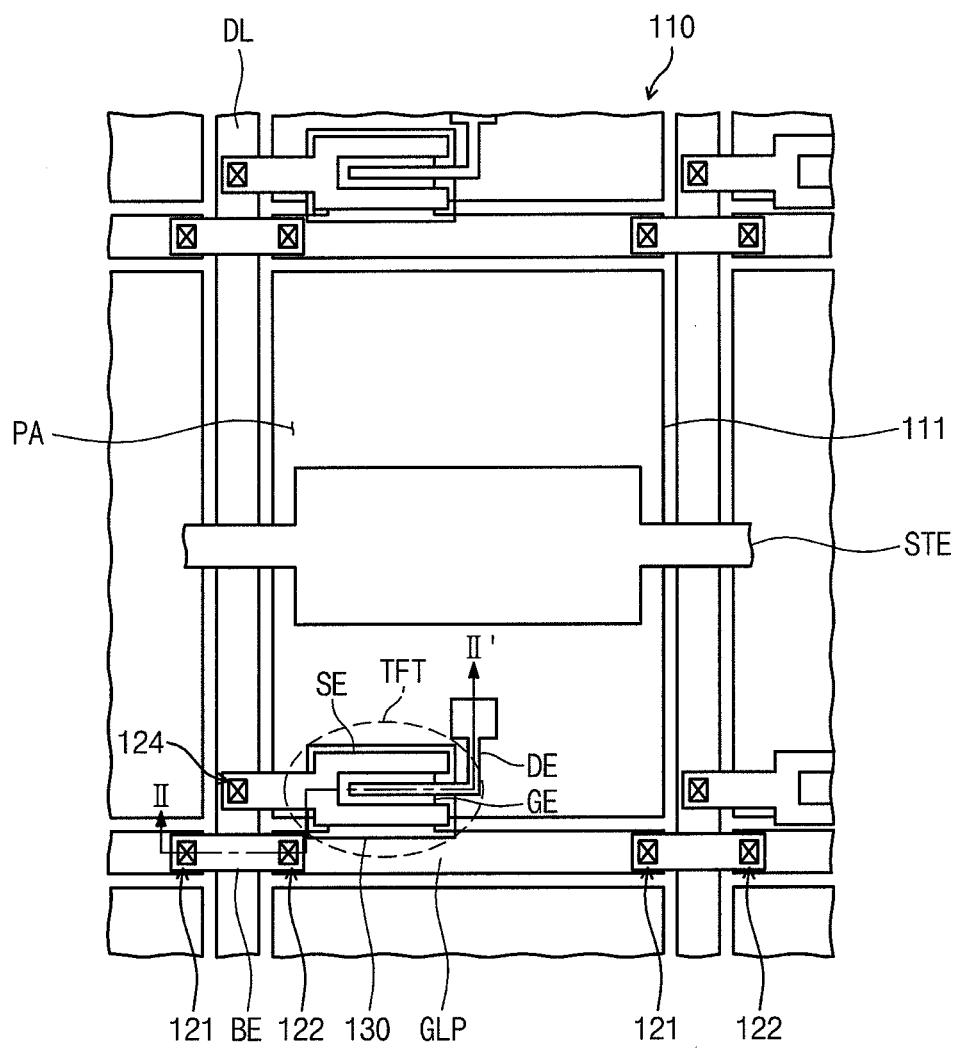
Figure 8C:
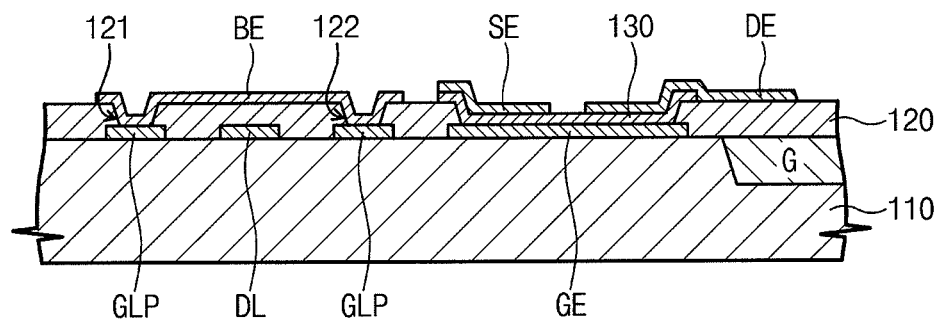

Referring to FIGS. 6F and 8C, a second metal layer is formed on the organic layer 120. The second metal layer is patterned to form a bridge electrode BE, a source electrode SE and a drain electrode DE. The bridge electrode BE is provided to electrically connect two adjacent gate-line pieces GLP to each other.

For example, the bridge electrode BE is connected to an end of a right gate-line pieces GLP exposed through the first contact hole 121 and an end of a left gate-line pieces GLP exposed through the second contact hole 122, thereby electrically connecting two adjacent gate-line pieces GLP to each other.

The source electrode SE is electrically connected to a corresponding data line of the data lines DL through the third contact hole 124, and the source electrode SE extends above the gate electrode GE. The drain electrode DE is positioned above the gate electrode GE and spaced apart from the source electrode SE. Accordingly, the thin film transistor TFT is formed on the base substrate 110.

When the second metal layer is patterned, a storage electrode STE may be formed in each pixel area PA. The storage electrode STE is located at a center portion in each pixel area PA and extended in a direction substantially parallel to the gate-line pieces GLP.

Figure 6G:
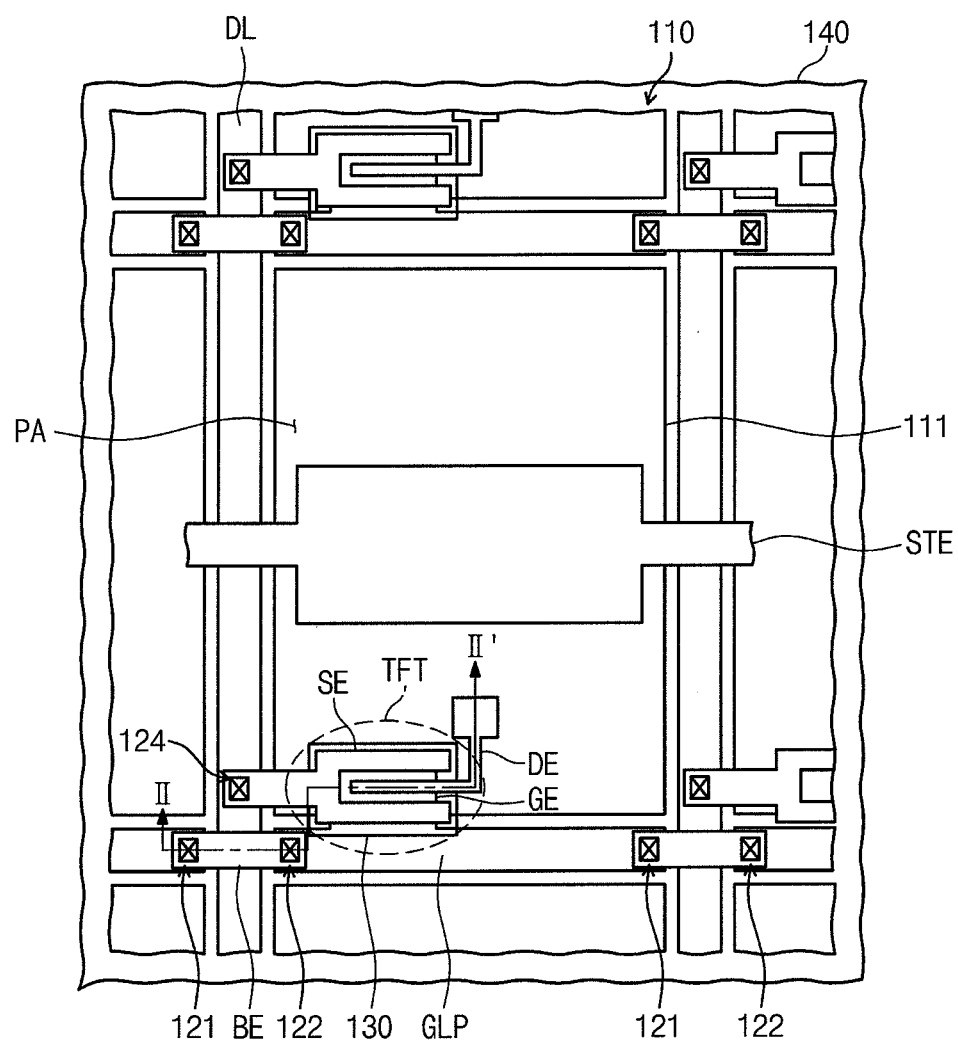
Figure 8D:
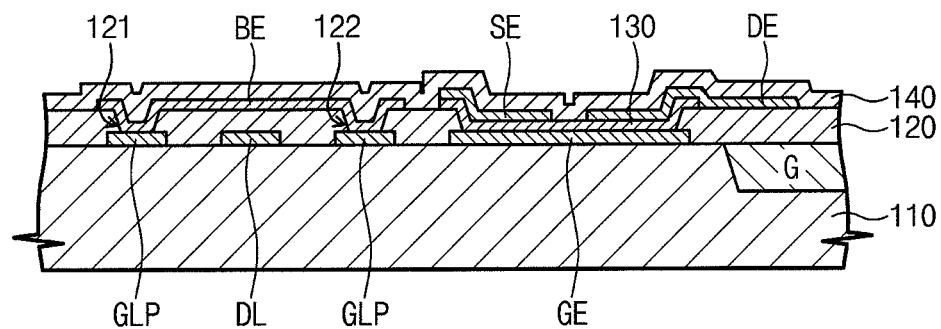

Referring to FIGS. 6G and 8D, a protective layer 140 is formed on the base substrate 110 to cover the thin film transistor TFT and the storage electrode STE.

Figure 6H:
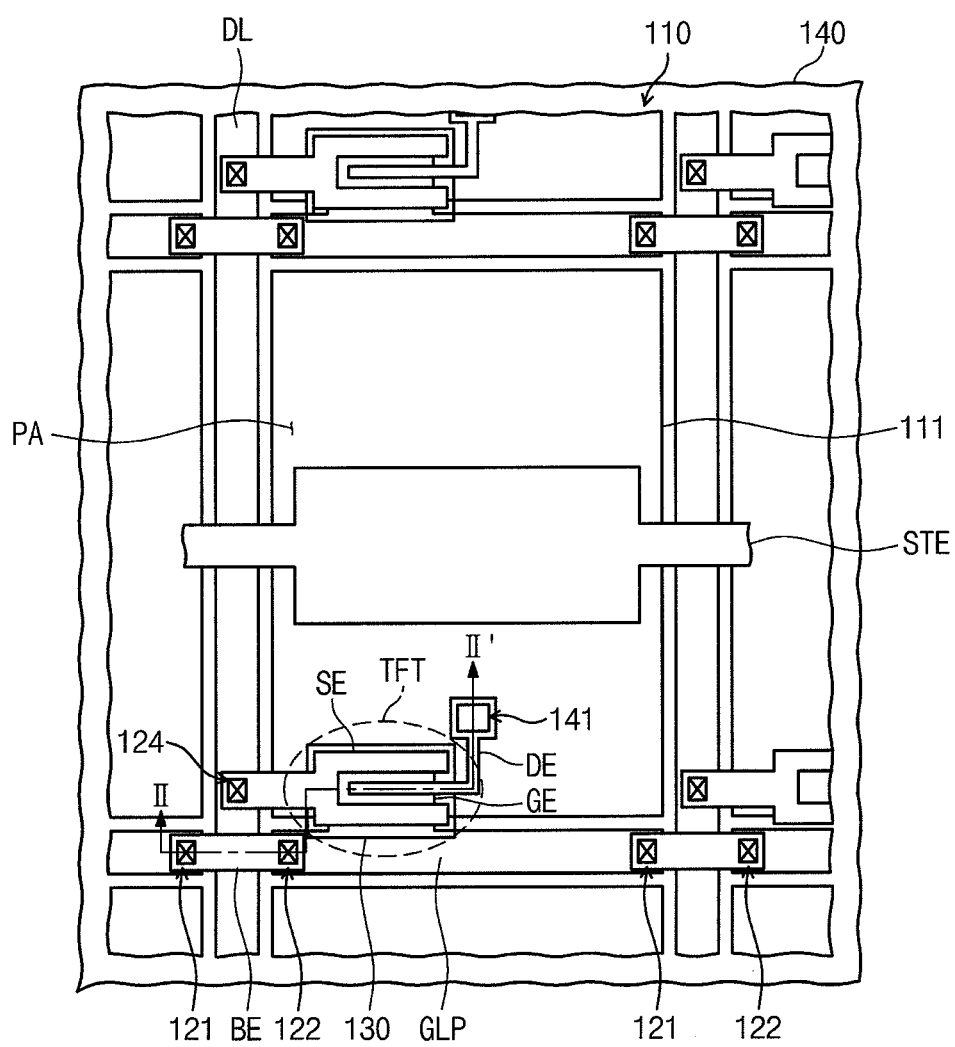
Figure 8E:
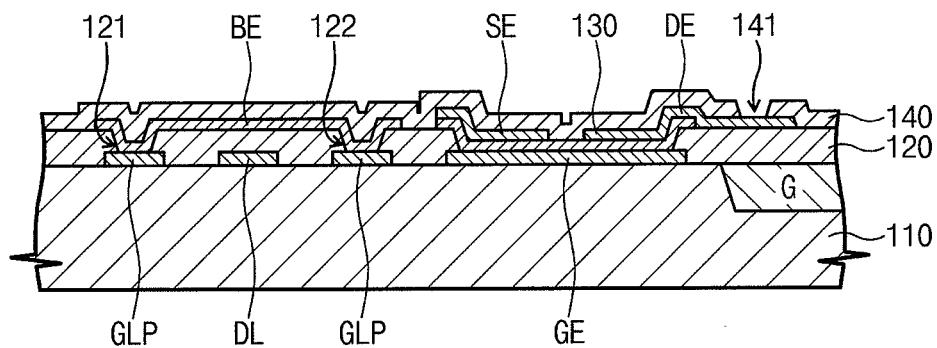

Referring to FIGS. 6H and 8E, the protective layer 140 is partially patterned to form a fourth contact hole 141 that exposes the drain electrode DE of the thin film transistor TFT.

Figure 6I:
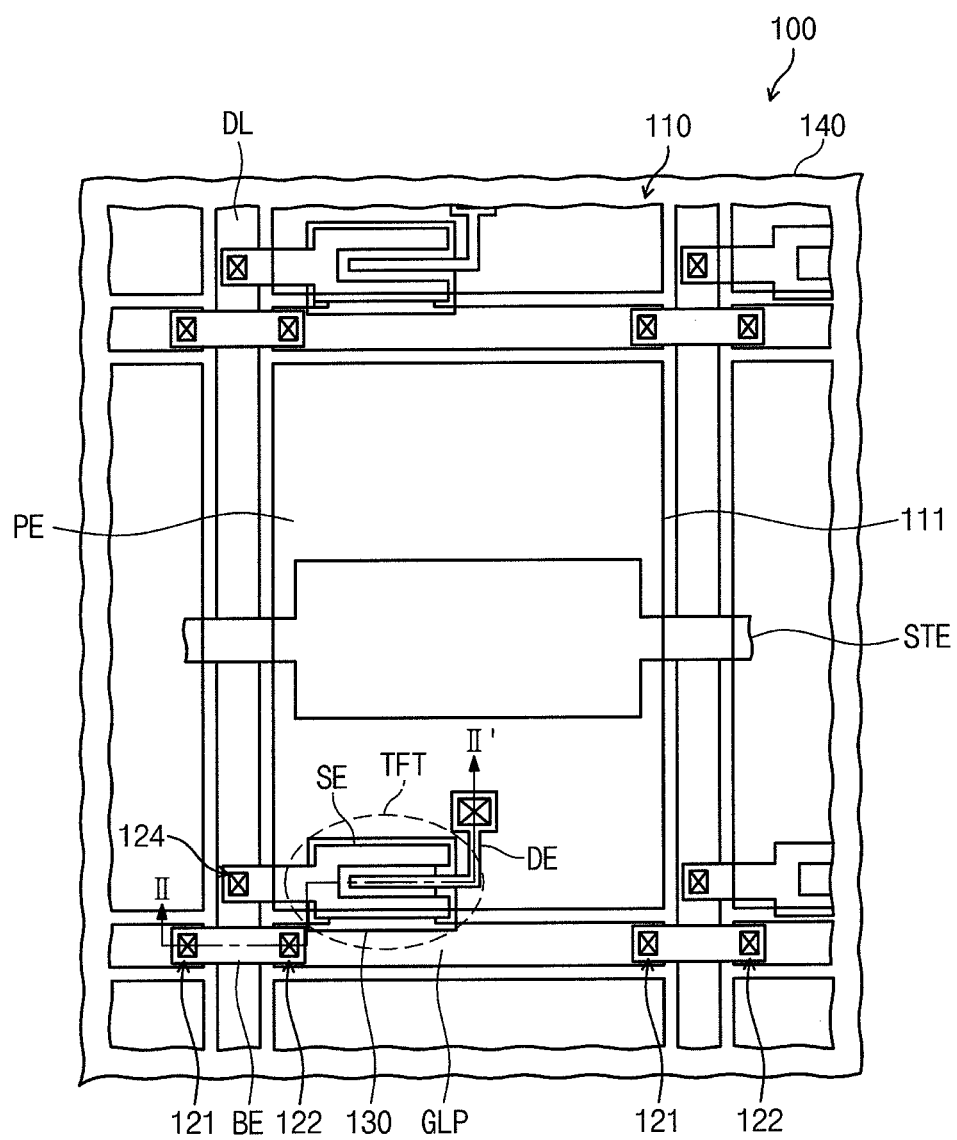
Figure 8F:
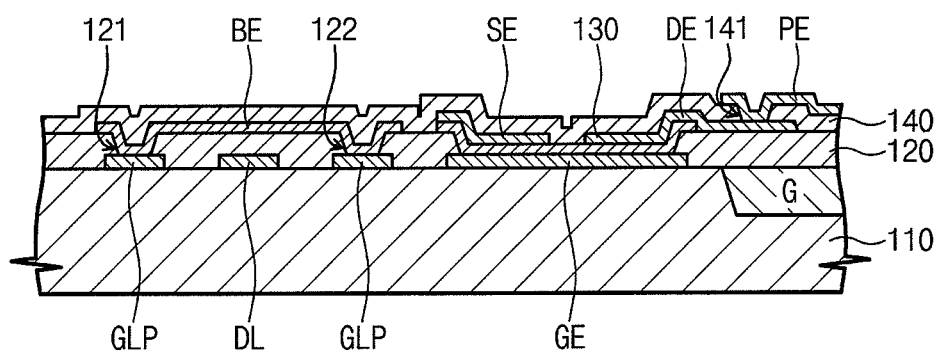

Referring to FIGS. 6I and 8F, a pixel electrode PE including a transparent conductive material is formed on the protective layer 140. The pixel electrode PE is electrically connected to the drain electrode DE through the fourth contact hole 141, thereby manufacturing the thin film transistor substrate 100.

In an exemplary embodiment, the organic layer 120 of the thin film transistor substrate 100 includes a low dielectric material having a dielectric constant of about 3. Thus, a parasitic capacitance between the data lines DL and the pixel electrode PE, which is proportion to the dielectric constant of the organic layer 120, may be reduced. In an exemplary embodiment, since the parasitic capacitance is reduced, a coupling phenomenon between the data lines DL and the pixel electrode PE may be prevented and a distance between the data lines DL and the pixel electrode PE may be reduced, so that an aperture ratio of the thin film transistor substrate 100 may be enhanced.

When the red, green and blue pixels R, G and B are formed in the trenches 111 of the thin film transistor substrate 100, the trenches 111 are formed by using the data lines DL and the gate-line pieces GLP applied to the thin film transistor substrate 100. Accordingly, a barrier wall used to print the red, green and blue pixels R, G and B may be formed without an additional process, so that the manufacturing process of the thin film transistor substrate 100 having a color-filter-on-array (COA) structure may be simplified.

In an exemplary embodiment, the trenches are formed in the glass substrate and the red, green and blue pixels are formed in the trenches through the inkjet printing process, so that the thickness of the organic black matrix is decreased and the color filter substrate has the flat surface. Accordingly, the display quality such as the contrast ratio of the display apparatus may be enhanced by employing the color filter substrate.

In an exemplary embodiment, since the organic black matrix may be formed through the inkjet printing process, the manufacturing cost for the color filter substrate may be reduced and the manufacturing process thereof may be simplified.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method of manufacturing a color filter substrate, the method comprising:
    forming a photoresist pattern on a surface of a transparent substrate;
    forming a plurality of trenches having a predetermined depth by etching the surface of the transparent substrate using the photoresist pattern as a mask, wherein a portion of the transparent substrate under the photoresist pattern is etched to form an undercut;
    partially removing the photoresist pattern such that a contact area of the photoresist pattern is identical to a contact area of the transparent substrate;
    disposing color filter material in each trench such that the color filter material overlaps a lower end of the photoresist pattern, wherein disposing the color filter material includes performing both a drop process and a bake process more than once in each trench to form a color filter layer;
    removing the photoresist pattern to thereby expose a side surface of the color filter layer and an upper surface of the transparent substrate;
    forming a black matrix including an organic material on the exposed side surface of the color filter layer and on the exposed upper surface of the transparent substrate where the photoresist pattern was is removed; and
    forming a transparent electrode on the color filter layer and the organic black matrix.

2. The method of claim 1, wherein the bake process is performed using a thermal jetting.

3. The method of claim 1, wherein the color filter layer has a thickness greater than a depth of the plurality of trenches.

4. The method of claim 3, wherein the color filter layer has a substantially identical thickness to a thickness obtained by adding the predetermined depth of the plurality of trenches to a thickness of the organic black matrix.

5. The method of claim 1, wherein the photoresist pattern is partially removed through a plasma ashing process.

6. The method of claim 1, wherein the organic black matrix is formed through an inkjet printing process.

7. The method of claim 1, wherein the predetermined depth is about 0.5 μm to about 5 μm when measured from the surface of the transparent substrate.

8. The method of claim 1, wherein etching the transparent substrate is performed by using an etching solution including HF or an HF mixture.

9. The method of claim 1, wherein the drop and bake processes are performed by an inkjet unit and a baking unit installed at a rear side of the inkjet unit without using additional bake equipment.

* * * * *